(12) United States Patent
Wang et al.

(10) Patent No.: US 10,784,461 B2
(45) Date of Patent: Sep. 22, 2020

(54) DISPLAY PANEL AND DISPLAY DEVICE

(71) Applicants: Hefei Xinsheng Optoelectronics Technology Co., Ltd., Hefei, Anhui (CN); BOE Technology Group Co., Ltd., Beijing (CN)

(72) Inventors: Xinzhu Wang, Beijing (CN); Youyuan Hu, Beijing (CN); Fei Li, Beijing (CN); Xinfeng Wu, Beijing (CN); Huihui Li, Beijing (CN)

(73) Assignees: Hefei Xinsheng Optoelectronics Technology Co., Ltd., Hefei, Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/426,014

(22) Filed: May 30, 2019

(65) Prior Publication Data

US 2020/0058896 A1 Feb. 20, 2020

(30) Foreign Application Priority Data

Aug. 17, 2018 (CN) .......................... 2018 1 0943506

(51) Int. Cl.
*H01L 51/52* (2006.01)
*H01L 27/32* (2006.01)
*H01L 51/56* (2006.01)

(52) U.S. Cl.
CPC ........ *H01L 51/5228* (2013.01); *H01L 27/322* (2013.01); *H01L 27/3258* (2013.01);
(Continued)

(58) Field of Classification Search
CPC ............. H01L 27/3276; H01L 51/5234; H01L 51/5228; H01L 51/5284; H01L 27/3258; H01L 51/5218
See application file for complete search history.

(56) References Cited

U.S. PATENT DOCUMENTS

| 2004/0056591 A1 | 3/2004 | Koo et al. |
| 2018/0006106 A1 | 1/2018 | Oh et al. |

(Continued)

FOREIGN PATENT DOCUMENTS

| CN | 100377383 C | 3/2008 |
| CN | 101656263 A | 2/2010 |

(Continued)

OTHER PUBLICATIONS

First Chinese Office Action issued in Chinese Patent Application No. 201810943506.4 dated Mar. 5, 2020.

(Continued)

*Primary Examiner* — Changhyun Yi
(74) *Attorney, Agent, or Firm* — Arent Fox LLP; Michael Fainberg (57) ABSTRACT

The disclosure discloses a display panel and a display device, and the display panel includes: a base substrate, a drive wire layer on the base substrate, a planarization layer on a side of the drive wire layer facing away from the base substrate, a plurality of anodes in a form of an array on a side of the planarization layer facing away from the drive wire layer, a light-emitting layer on sides of respective anodes and the planarization layer facing away from the drive wire layer, and a transparent cathode layer on a side of the light-emitting layer facing away from the respective anodes, where the planarization layer includes grooves between the respective anodes, and auxiliary cathodes on a surface of the transparent cathode layer on a side thereof facing away from the light-emitting layer are arranged in the grooves.

18 Claims, 5 Drawing Sheets

(52) U.S. Cl.
CPC ...... *H01L 27/3272* (2013.01); *H01L 27/3276* (2013.01); *H01L 51/5218* (2013.01); *H01L 51/5225* (2013.01); *H01L 51/5234* (2013.01); *H01L 51/5253* (2013.01); *H01L 51/5284* (2013.01); *H01L 51/56* (2013.01); *H01L 2227/323* (2013.01); *H01L 2251/5315* (2013.01)

(56) References Cited

U.S. PATENT DOCUMENTS

| | | | |
|---|---|---|---|
| 2018/0212179 A1 | 7/2018 | Yu | |
| 2018/0358573 A1* | 12/2018 | Maeda | ................ H01L 51/5036 |
| 2020/0083489 A1 | 3/2020 | Fang et al. | |

FOREIGN PATENT DOCUMENTS

| | | | |
|---|---|---|---|
| CN | 101968948 A | 2/2011 |
| CN | 106654047 A | 5/2017 |
| CN | 107579093 A | 1/2018 |
| CN | 107731877 A | 2/2018 |
| CN | 107731883 A | 2/2018 |

OTHER PUBLICATIONS

Second Chinese Office Action issued in Chinese Patent Application No. 201810943506.4 dated May 22, 2020.

* cited by examiner

DISPLAY PANEL AND DISPLAY DEVICE

CROSS-REFERENCE TO RELATED APPLICATION

This application claims priority to Chinese Patent Application No. 201810943506.4, filed on Aug. 17, 2018, the content of which is incorporated by reference in the entirety.

FIELD

This disclosure relates to the field of display technologies, and particularly to a display panel and a display device.

BACKGROUND

In the related art, an Organic Light-Emitting Diode (OLED) display panel has been widely applied in the field of display technologies due its wide angle, high contrast, high response speed, low driving voltage, and other advantages.

SUMMARY

Embodiments of the disclosure provide a display panel and a display device.

In an aspect, the embodiments of the disclosure provide a display panel including: a base substrate; a drive wire layer on the base substrate; a planarization layer on a side of the drive wire layer facing away from the base substrate; a plurality of anodes in a form of an array on a side of the planarization layer facing away from the drive wire layer; a light-emitting layer on sides of the plurality of anodes and the planarization layer facing away from the drive wire layer; and a transparent cathode layer on a side of the light-emitting layer facing away from the plurality of anodes; wherein the planarization layer includes grooves between respective anodes; and the display panel further includes auxiliary cathodes, in the grooves, on a surface of the transparent cathode layer on a side thereof facing away from the light-emitting layer.

In some embodiments, in the display panel above according to the embodiments of the disclosure, a material of the auxiliary cathodes is an opaque conductive adhesive with conductive particles dispersed therein.

In some embodiments, in the display panel above according to the embodiments of the disclosure, the conductive particles include one or more of gold, silver, copper, aluminum, zinc, iron, nickel, or graphite.

In some embodiments, in the display panel above according to the embodiments of the disclosure, surfaces of the auxiliary cathodes on sides thereof facing away from the base substrate are flush with a surface of the transparent cathode layer, outside the grooves, on a side thereof facing away from the base substrate; or surfaces of the auxiliary cathodes on sides thereof facing away from the base substrate are lower than a surface of the transparent cathode layer, outside the grooves, on a side thereof facing away from the base substrate.

In some embodiments, in the display panel above according to the embodiments of the disclosure, the display panel further includes: an encapsulation cover plate on a side of the transparent cathode layer facing away from the light-emitting layer, and a color filter layer on a surface of the encapsulation cover plate on a side thereof facing the transparent cathode layer; and the color filter layer includes: color filter blocks corresponding to the plurality of anodes in a one-to-one manner, and light-shielding layers between respective color filter blocks.

In some embodiments, in the display panel above according to the embodiments of the disclosure, the display panel further includes: an encapsulation layer on a surface of the transparent cathode layer on a side thereof facing away from the light-emitting layer, and a color filter layer on a surface of the encapsulation layer on a side thereof facing away from the transparent cathode layer; and the color filter layer includes: color filter blocks corresponding to the plurality of anodes in a one-to-one manner, and light-shielding layers between respective color filter blocks.

In some embodiments, in the display panel above according to the embodiments of the disclosure, orthographic projections of the light-shielding layers onto the base substrate lie into orthographic projections of the auxiliary cathodes onto the base substrate; and widths of the auxiliary cathodes in the grooves are greater than or equal to widths of corresponding light-shielding layers.

In some embodiments, in the display panel above according to the embodiments of the disclosure, thicknesses of the light-shielding layers are greater than thicknesses of the respective color filter blocks; and the light-shielding layers come into contact with auxiliary cathodes corresponding thereto in position, and gaps exist between the respective color filter blocks and the transparent cathode layer.

In some embodiments, in the display panel above according to the embodiments of the disclosure, the light-shielding layers come into contact with auxiliary cathodes corresponding thereto in position; and orthographic projections of the encapsulation layer and the light-shielding layers onto the base substrate do not overlap with each other.

In some embodiments, in the display panel above according to the embodiments of the disclosure, at least one of the plurality of anodes includes: a reflection layer on a surface of the planarization layer on a side thereof facing away from the drive wire layer, and a transparent conductive layer on a surface of the reflection layer on a side thereof facing away from the planarization layer; and the transparent conductive layer is only on the surface of the reflection layer, or is on both the surface of the reflection layer and a surface of an inner sidewall of a corresponding groove.

In another aspect, the embodiments of the disclosure further provide a display device, including a display panel, wherein the display panel includes: a base substrate; a drive wire layer on the base substrate; a planarization layer on a side of the drive wire layer facing away from the base substrate; a plurality of anodes in a form of an array on a side of the planarization layer facing away from the drive wire layer; a light-emitting layer on sides of the plurality of anodes and the planarization layer facing away from the drive wire layer; and a transparent cathode layer on a side of the light-emitting layer facing away from the plurality of anodes; wherein the planarization layer includes grooves between respective anodes; and the display panel further includes auxiliary cathodes, in the grooves, on a surface of the transparent cathode layer on a side thereof facing away from the light-emitting layer.

In some embodiments, in the display device above according to the embodiments of the disclosure, a material of the auxiliary cathodes is an opaque conductive adhesive with conductive particles dispersed therein.

In some embodiments, in the display device above according to the embodiments of the disclosure, the conductive particles include one or more of gold, silver, copper, aluminum, zinc, iron, nickel, or graphite.

In some embodiments, in the display device above according to the embodiments of the disclosure, surfaces of the auxiliary cathodes on sides thereof facing away from the base substrate are flush with a surface of the transparent cathode layer, outside the grooves, on a side thereof facing away from the base substrate; or surfaces of the auxiliary cathodes on sides thereof facing away from the base substrate are lower than a surface of the transparent cathode layer, outside the grooves, on a side thereof facing away from the base substrate.

In some embodiments, in the display device above according to the embodiments of the disclosure, the display panel further includes: an encapsulation cover plate on a side of the transparent cathode layer facing away from the light-emitting layer, and a color filter layer on a surface of the encapsulation cover plate on a side thereof facing the transparent cathode layer; and the color filter layer includes: color filter blocks corresponding to the plurality of anodes in a one-to-one manner, and light-shielding layers between respective color filter blocks; or the display panel further includes: an encapsulation layer on a surface of the transparent cathode layer on a side thereof facing away from the light-emitting layer, and a color filter layer on a surface of the encapsulation layer on a side thereof facing away from the transparent cathode layer; and the color filter layer includes: color filter blocks corresponding to the plurality of anodes in a one-to-one manner, and light-shielding layers between respective color filter blocks.

In some embodiments, in the display device above according to the embodiments of the disclosure, orthographic projections of the light-shielding layers onto the base substrate lie into orthographic projections of the auxiliary cathodes onto the base substrate; and widths of the auxiliary cathodes in the grooves are greater than or equal to widths of corresponding light-shielding layers.

In some embodiments, in the display device above according to the embodiments of the disclosure, when the display panel further includes the encapsulation cover plate on the side of the transparent cathode layer facing away from the light-emitting layer, and the color filter layer on the surface of the encapsulation cover plate on the side thereof facing the transparent cathode layer, thicknesses of the light-shielding layers are greater than thicknesses of the respective color filter blocks; and the light-shielding layers come into contact with auxiliary cathodes corresponding thereto in position, and gaps exist between the respective color filter blocks and the transparent cathode layer.

In some embodiments, in the display device above according to the embodiments of the disclosure, when the display panel further includes the encapsulation layer on the surface of the transparent cathode layer on the side thereof facing away from the light-emitting layer, and the color filter layer on the surface of the encapsulation layer on the side thereof facing away from the transparent cathode layer, the light-shielding layers come into contact with auxiliary cathodes corresponding thereto in position; and orthographic projections of the encapsulation layer and the light-shielding layers onto the base substrate do not overlap with each other.

In some embodiments, in the display device above according to the embodiments of the disclosure, at least one of the plurality of anodes includes: a reflection layer on a surface of the planarization layer on a side thereof facing away from the drive wire layer, and a transparent conductive layer on a surface of the reflection layer on a side thereof facing away from the planarization layer; and the transparent conductive layer is only on the surface of the reflection layer, or is on both the surface of the reflection layer and a surface of an inner sidewall of a corresponding groove.

BRIEF DESCRIPTION OF THE DRAWINGS

In order to make the technical solutions according to the embodiments of the disclosure more apparent, the drawings to which a description of the embodiments refers will be briefly introduced below, and apparently the drawings to be described below are merely illustrative of some of the embodiments of the disclosure, and those ordinarily skilled in the art can derive from these drawings other drawings without any inventive effort.

DETAILED DESCRIPTION OF THE EMBODIMENTS

In the related art, OLED display panels can be categorized into an OLED display panel with a top-emitting structure or an OLED display panel with a bottom-emitting structure, where there is a limited aperture ratio of the OLED display panel in the bottom-emitting structure because the OLED display panel may be shielded by an underlying wire, so the OLED display panel in the top-emitting structure with a higher aperture ratio than that of the OLED display panel in the bottom-emitting structure is more widely applied.

However, the transmittance of a cathode in the OLED display panel in the top-emitting structure shall be as high as possible, so a thickness of the cathode shall be made as small as possible to thereby improve the transmittance thereof, thus resulting in such a high resistance of the cathode that may hinder an image from being displayed.

The embodiments of the disclosure provide a display panel and a display device so as to reduce the resistance of a cathode while improving the transmittance thereof.

In order to make the objects, technical solutions, and advantages of the disclosure more apparent, the disclosure will be described below in further details with reference to the drawings. Apparently the embodiments to be described are only a part but not all of the embodiments of the disclosure. Based upon the embodiments here of the disclosure, all of other embodiments which can occur to those ordinarily skilled in the art without any inventive effort shall come into the scope of the disclosure as claimed.

The display panel and the display device according to the embodiments of the disclosure will be described below in details.

Figure 1:
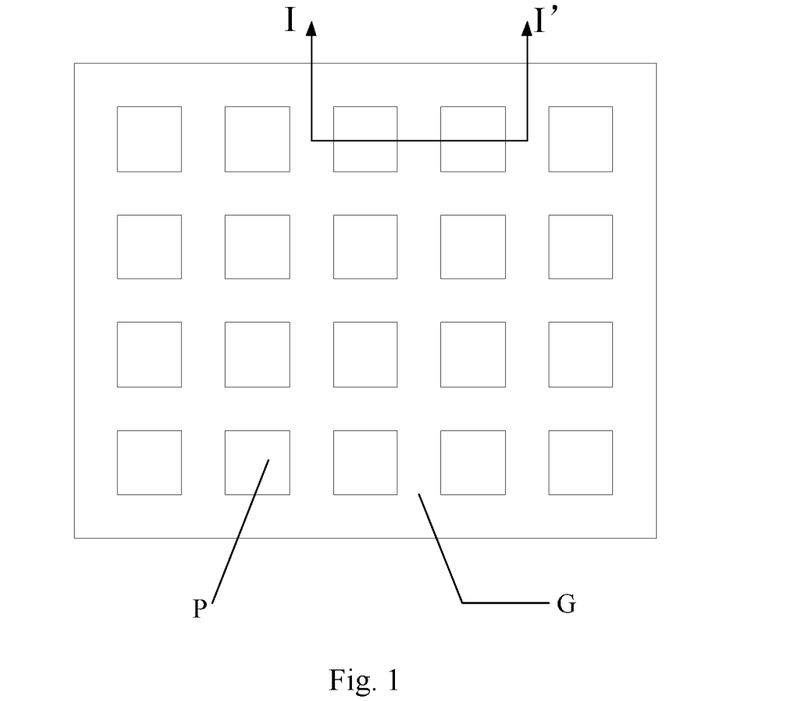
FIG. 1 is a schematic structural diagram of a display panel according to the embodiments of the disclosure in a sectional view.
Figure 2:
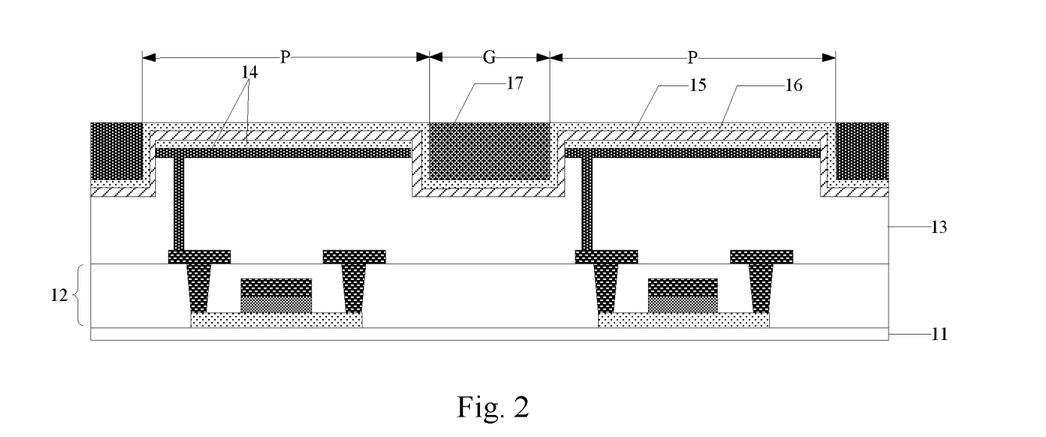
FIG. 2 is a first schematic structural diagram of the display panel as illustrated in FIG. 1 in a sectional view along II'.

FIG. 1 illustrates a top view of a display panel according to the embodiments of the disclosure, where the display panel includes a plurality of pixel units P, and grooves G between respective pixel units P for forming auxiliary cathodes; and FIG. 2 illustrates a sectional view of the display panel along II', where the display panel according to the embodiments of the disclosure includes: a base substrate 11, a drive wire layer 12 on the base substrate 11, a planarization layer 13 on a side of the drive wire layer 12 facing away from the base substrate 11, a plurality of anodes 14 in a form of an array on a side of the planarization layer 13 facing away from the drive wire layer 12, a light-emitting layer 15 on sides of respective anodes 14 and the planarization layer 13 facing away from the drive wire layer 12, and a transparent cathode layer 16 on a side of the light-emitting layer 15 facing away from the anodes 14; where the planarization layer 13 includes grooves G between the respective anodes 14; and the display panel further includes auxiliary cathodes 17, in the grooves G, on a surface of the transparent cathode layer 16 on a side thereof facing away from the light-emitting layer 15.

In the display panel above according to the embodiments of the disclosure, the grooves G for forming the auxiliary cathodes 17 are formed on the planarization layer 13, and the auxiliary cathodes 17 are arranged in the grooves G, so that the transparent cathode layer 16 can be made of a transparent conductive material, and the auxiliary cathodes 17 can come into contact with the transparent cathode layer 16, thus lowering a total resistance of a cathode while improving the transmittance thereof, and facilitating displaying of an image.

As compared with the display panel in the related art in which respective anodes are spaced from each other by a pixel definition layer, a patterning process for forming a pixel definition layer can be dispensed with in the display panel above according to the embodiments of the disclosure to thereby reduce the number of process operations, and simplify the fabrication process thereof. The auxiliary cathodes are formed directly on the transparent cathode layer in the grooves to thereby avoid such a risk that the transparent cathode layer may be damaged because the auxiliary cathodes come into poor contact therewith. Further, in the display panel above according to the embodiments of the disclosure, the size of a peripheral bezel will not be affected, and an aperture ratio of the display panel will not be lowered, and for example, laser puncturing and other processes will not be performed, thus avoiding a resulting risk of a display defect. In a practical application, a width and a depth (i.e. a thickness) of a groove G formed on the planarization layer 13 can be adjusted as needed for the resistance of a cathode and an aperture ratio, and as the thickness and the width of an auxiliary cathode 17 formed in a groove G are increasing, an equivalent resistance of the cathode is decreasing; and the thickness and the width of the cathode can be set as needed in a practical implementation, although the embodiments of the disclosure will not be limited thereto.

In the display panel above according to the embodiments of the disclosure, an auxiliary cathode 17 can be made of an opaque conductive adhesive material, where conductive particles are dispersed in the opaque conductive adhesive material. By way of an example, the auxiliary cathode can be made of a black conductive adhesive, or a light-reflecting conductive adhesive. The auxiliary cathode made of the opaque conductive adhesive material can avoid a crosstalk from occurring between light emitted by the light-emitting layer of two pixel units on two sides of the auxiliary cathode 17, and the auxiliary cathode made of the conductive adhesive material can facilitate both the bonding of the auxiliary cathode 17 with the transparent cathode layer 16 below the auxiliary cathode, and the bonding of the auxiliary cathode 17 with another layer above the auxiliary cathode. In the related art, the conductive adhesive can be categorized into conductive adhesive which can be cured at room temperature, moderate temperature, high temperature, or UV rays dependent upon how to cure it, or can be categorized into isotropic or anisotropic conductive adhesive dependent upon its conductive direction. In the embodiments of the disclosure, the conductive adhesive can be isotropic conductive adhesive which can be cured at moderate temperature, or in a practical application, the conductive adhesive can be another type of conductive adhesive as needed in a practical fabrication process, although the embodiments of the disclosure will not be limited thereto.

In order to improve the conductivity of the conductive adhesive, conductive particles are dispersed in the conductive adhesive in the embodiments of the disclosure, where the conductive particles can include one or more of gold, silver, copper, aluminum, zinc, iron, nickel, or graphite. In addition, a conductive compound can alternatively be dispersed in the conductive adhesive as conductive particles, although the embodiments of the disclosure will not be limited thereto.

Figure 3:
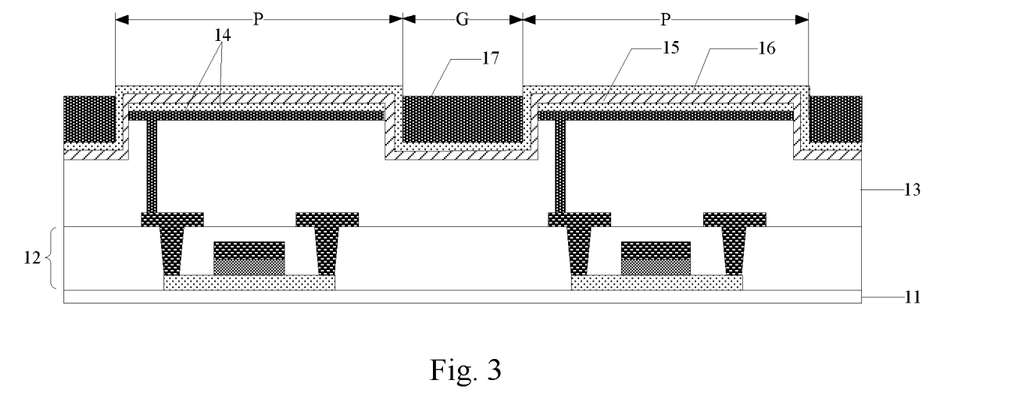
FIG. 3 is a second schematic structural diagram of the display panel according to the embodiments of the disclosure in a sectional view.

In some embodiments, as illustrated in FIG. 2, a surface of an auxiliary cathode 17 on a side thereof facing away from the base substrate 11 can be flush with a surface of the transparent cathode layer 16, located outside a corresponding groove G, on a side thereof facing away from the base substrate 11; or as illustrated in FIG. 3, the surface of the auxiliary cathode 17 on the side thereof away facing from the base substrate 11 can be lower than the surface of the transparent cathode layer 16, located outside the corresponding groove G, on the side thereof facing away from the base substrate 11. As described above, the auxiliary cathode 17 can be made of a material through which no light can be transmitted, so in order to avoid the auxiliary cathode 17 from affecting an aperture ratio of the display panel, the surface of the auxiliary cathode 17 is arranged lower than or flush with the surface of the transparent cathode layer 16 located outside the corresponding groove, that is, the auxiliary cathode 17 is only arranged in the corresponding groove, to thereby avoid the auxiliary cathode from overflowing the corresponding groove and thus affecting an aperture ratio of an adjacent pixel unit and also damaging the transparent cathode layer located outside the corresponding groove.

Figure 4:
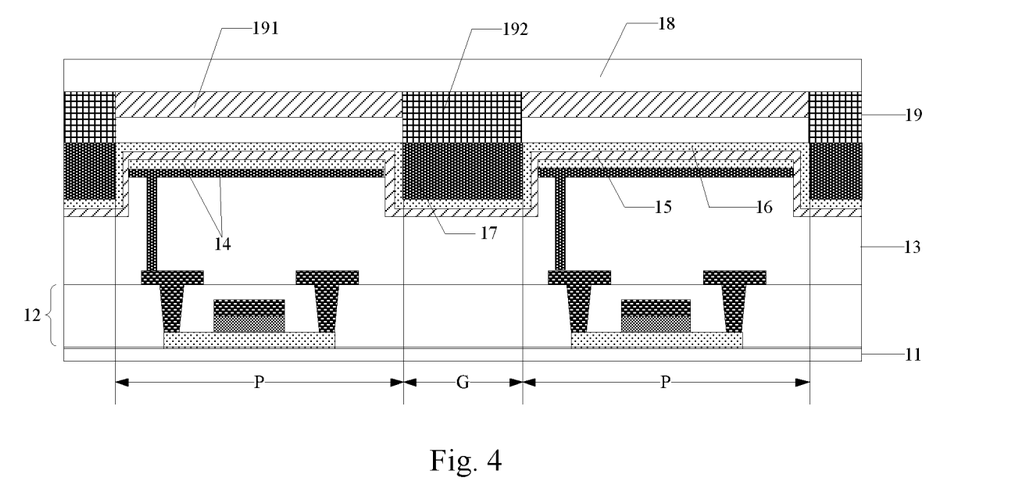
FIG. 4 is a third schematic structural diagram of the display panel according to the embodiments of the disclosure in a sectional view.

In some embodiments, the display panel above according to the embodiments of the disclosure can be encapsulated in two forms, where when the display panel is encapsulated using an encapsulation cover plate, as illustrated in FIG. 4, the display panel further include: an encapsulation cover plate 18 on a side of the transparent cathode layer 16 facing away from the light-emitting layer 15, and a color filter layer 19 on a surface of the encapsulation cover plate 18 on a side thereof facing the transparent cathode layer 16, where the color filter layer 19 includes: color filter blocks 191 corresponding to the anodes 14 in a one-to-one manner, and light-shielding layers 192 between respective color filter blocks 191.

Figure 5:
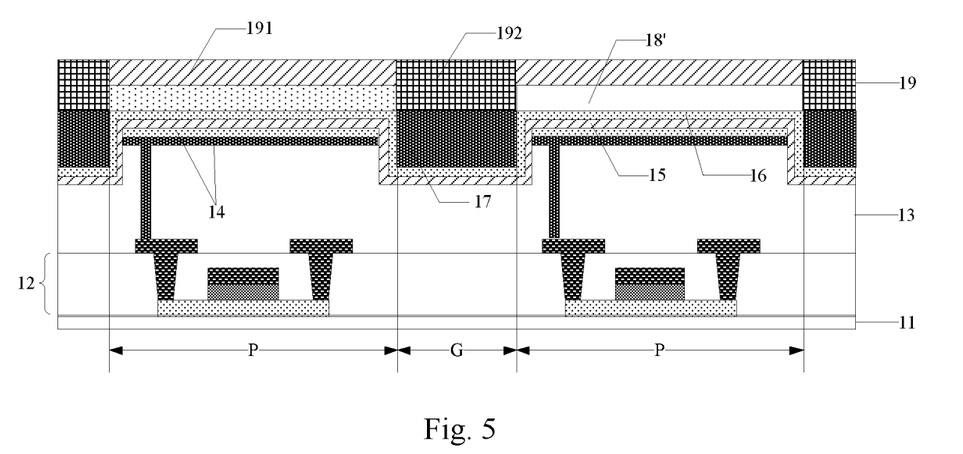
FIG. 5 is a fourth schematic structural diagram of the display panel according to the embodiments of the disclosure in a sectional view.

When the display panel is encapsulated using a thin film, as illustrated in FIG. 5, the display panel further includes: an encapsulation layer 18' on a surface of the transparent cathode layer 16 on a side thereof facing away from the light-emitting layer 15, and a color filter layer 19 on a surface of the encapsulation layer 18' on a side thereof facing away from the transparent cathode layer 16, where the color filter layer 19 includes: color filter blocks 191 corresponding to the anodes 14 in a one-to-one manner, and light-shielding layers 192 between respective color filter blocks 191.

In the embodiments of the disclosure, the light-shielding layers 192 are configured to space the respective color filter blocks 191 from each other, the respective color filter blocks 191 correspond to the respective anodes 14 in a one-to-one manner; and the anodes 14, the light-emitting layer 15, the transparent cathode layer 16, in areas where the anodes are located, constitute respective organic light-emitting diodes; and the organic light-emitting diodes, and the color filter blocks 191 above them constitute respective pixel units. In a practical application, the display panel can be encapsulated in either of the two encapsulation forms above, although the embodiments of the disclosure will not be limited thereto.

Figure 6:
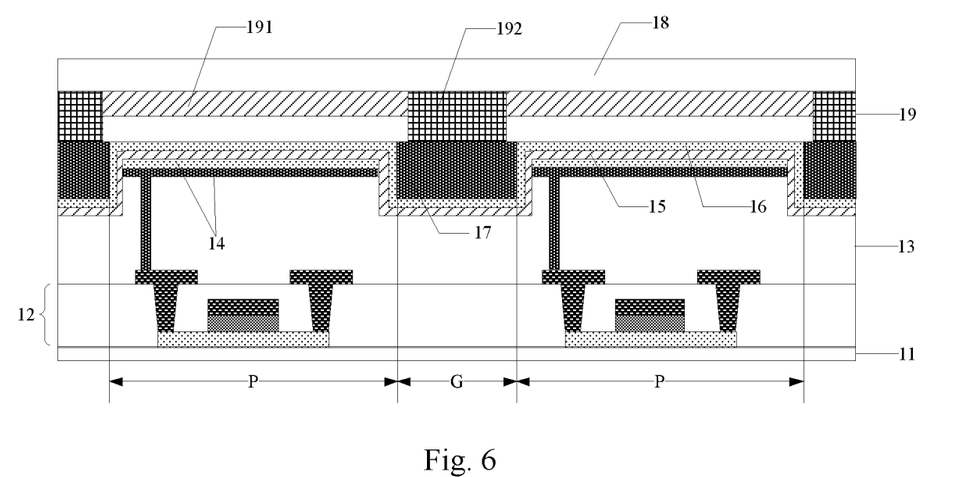
FIG. 6 is a fifth schematic structural diagram of the display panel according to the embodiments of the disclosure in a sectional view.
Figure 7:
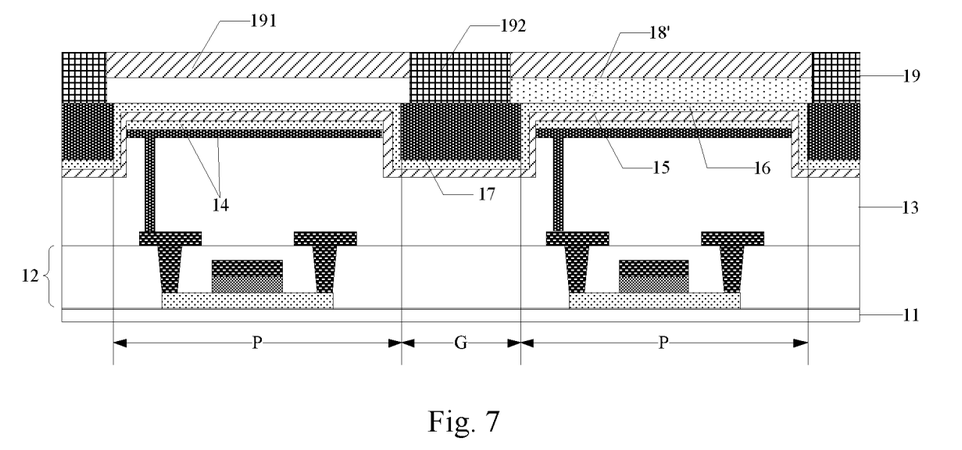
FIG. 7 is a sixth schematic structural diagram of the display panel according to the embodiments of the disclosure in a sectional view.

As illustrated in FIG. 4 and FIG. 5, orthographic projections of the light-shielding layers 192 onto the base substrate 11 lie into orthographic projections of the auxiliary cathodes 17 onto the base substrate 11. Where a width of an auxiliary cathode 17 in a groove G is greater than or equal to a width of a corresponding light-shielding layer 192. For example, as illustrated in FIG. 4 and FIG. 5, a width of an auxiliary cathode 17 can be equal to a width of a corresponding light-shielding layer 192, or as illustrated in FIG. 6 and FIG. 7, a width of an auxiliary cathode 17 can alternatively be greater than a width of a corresponding light-shielding layer 192; where the display panel is encapsulated using an encapsulation cover plate as illustrated in FIG. 4 and FIG. 6, and using a thin film as illustrated in FIG. 5 and FIG. 7. In a practical implementation, since an auxiliary cathode 17 can be made of a conductive adhesive material, the light-shielding layer 192 can be bonded directly with the conductive adhesive. Further, the width of the light-shielding layer 192 can be set smaller than or equal to the width of the auxiliary cathode 17 to thereby avoid the light-shielding layer 192 with a too large size from affecting an aperture ratio of the display panel, and also avoid the light-shielding layer 192 with a too large width from damaging the transparent cathode layer 16.

In some embodiments, as illustrated in FIG. 4, in the display panel according to the embodiments of the disclosure, which is encapsulated using an encapsulation cover plate, thicknesses of respective light-shielding layers 192 are greater than thicknesses of the respective color filter blocks 191, the respective light-shielding layers 192 come into contact with auxiliary cathodes 17 corresponding thereto in position, and gaps exist between the respective color filter blocks 191 and the transparent cathode layer 16. In a practical implementation, the display panel is encapsulated when the conductive adhesive of the auxiliary cathodes 17 is semi-cured, so that the light-shielding layers 192 are bonded with their corresponding auxiliary cathodes 17, and if the thicknesses of the light-shielding layers 192 are set greater than the thicknesses of the color filter blocks 191, then the color filter blocks will be avoided from coming into contact with the transparent cathode layer 16 while the display panel is being encapsulated, so there will be no risk of damaging the transparent cathode layer while the display panel is being encapsulated.

In some embodiments, as illustrated in FIG. 5, in the display panel according to the embodiments of the disclosure, which is encapsulated using a thin film, the light-shielding layers 192 come into contact with auxiliary cathodes 17 corresponding thereto in position, and orthographic projections of the encapsulation layer 18' and the light-shielding layers 192 onto the base substrate do not overlap with each other. When the display panel is encapsulated using a thin film, a whole layer of encapsulation layer 18' can be formed on the transparent cathode layer 16 and the auxiliary cathodes 17, and further etched to expose at least a part of the auxiliary cathodes 17 so that the light-shielding layers 192 in the color filter layer can come into contact with the auxiliary cathodes 17 to thereby avoid a transverse crosstalk between light emitted by two pixel units on two sides of a light-shielding layer.

Figure 8:
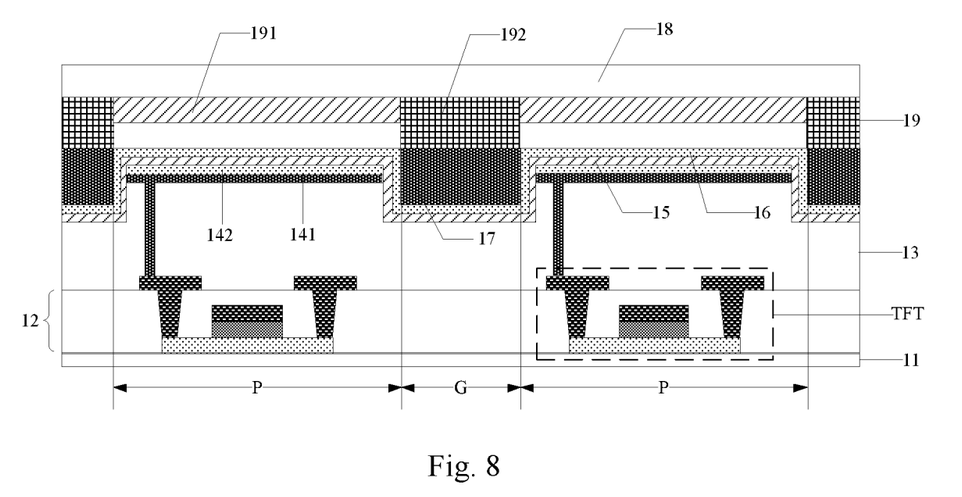
FIG. 8 is a seventh schematic structural diagram of the display panel according to the embodiments of the disclosure in a sectional view.

In some embodiments, the display panel above according to the embodiments of the disclosure is a top-emitting display panel, so the anodes 14 are reflective anodes, and as illustrated in FIG. 8, an anode can include: a reflection layer 141 on a surface of the planarization layer 13 on a side thereof facing away from the drive wire layer 12, and a transparent conductive layer 142 on a surface of the reflection layer 141 on a side thereof facing away from the planarization layer 13. Where the transparent conductive layer 142 can be located only on the surface of the reflection layer 141, or as illustrated in FIG. 9, the transparent conductive layer 142 can be located on both the surface of the reflection layer 141, and a surface of an inner sidewall of a corresponding groove G.

In some embodiments, the reflection layer 141 can be made of a light-reflecting metal material, and configured to reflect light emitted by the light-emitting layer 15 so that light rays are finally emitted from the top. The transparent conductive layer 142 on the reflection layer 141 can be made of Indium Tin Oxide (ITO) or another transparent conductive material. In a practical implementation, the transparent conductive layer 142 can be formed only on the reflection layer 141, so the transparent conductive layer and the reflection layer can be formed in the same mask process; and the transparent conductive layer 142 can alternatively extend onto a surface of an inner sidewall of a corresponding groove G, so the light-emitting layer in the groove can emit light under the action of an anode and a cathode to thereby improve a light-emitting area of a pixel unit so as to improve the display brightness.

Figure 9:
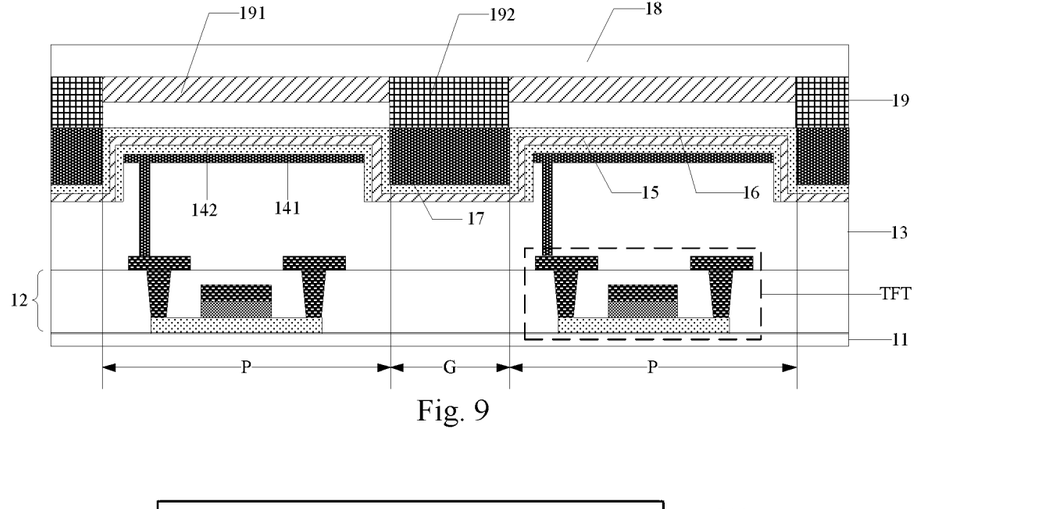
FIG. 9 is an eighth schematic structural diagram of the display panel according to the embodiments of the disclosure in a sectional view.

In some embodiments, as illustrated in FIG. 8 and FIG. 9, the drive wire layer 12 includes a plurality of Thin Film Transistors TFTs corresponding to the respective anodes 14 (i.e., the respective pixel units) in a one-to-one manner, where a source or a drain of a thin film transistor can be connected with an anode above the thin film transistor through a via-hole extending through the planarization layer, and configured to control a signal to be applied to the anode. In addition to this, the drive wire layer further includes a plurality of signal wires for connecting a drive chip with the respective TFTs; and as illustrated in FIG. 8 and FIG. 9, the respective TFTs can be arranged below their corresponding anodes, and the respective signal wires (not illustrated) can be arranged in areas corresponding to the anodes 14 as many as possible, to thereby reduce overlapping areas between the signal wires and the auxiliary cathodes 17 so as to lower parasitic capacitances between the signal wires and the auxiliary cathodes.

Based upon the same inventive concept, the embodiments of the disclosure further provide a display device including the display panel according to any one of the embodiments above of the disclosure. The display device can be an Organic Light-Emitting Diode (OLED) display panel, an OLED display, an OLED TV set, or another display device, or can be a mobile phone, a tablet computer, a smart photo album, or another mobile device. Since the display device addresses the problem under a similar principle to the display panel above, reference can be made to the implementation of the display panel above for an implementation of the display device, so a repeated description thereof will be omitted here.

Figure 10:
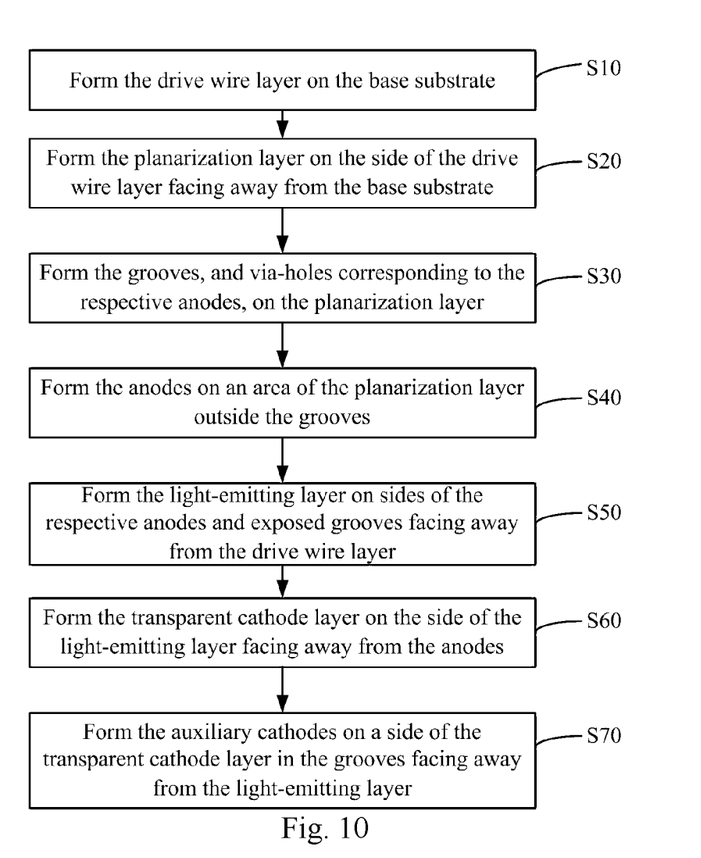
FIG. 10 is a flow chart of a method for fabricating a display panel according to the embodiments of the disclosure.

In another aspect, the embodiments of the disclosure further provide a method for fabricating the display panel above, and as illustrated in FIG. 10, the method includes the following operations.

The operation S10 is to form the drive wire layer on the base substrate.

The operation S20 is to form the planarization layer on the side of the drive wire layer facing away from the base substrate.

The operation S30 is to form the grooves, and via-holes corresponding to the respective anodes, on the planarization layer.

The operation S40 is to form the anodes on an area of the planarization layer outside the grooves.

The operation S50 is to form the light-emitting layer on sides of the respective anodes and exposed grooves facing away from the drive wire layer.

The operation S60 is to form the transparent cathode layer on the side of the light-emitting layer facing away from the anodes.

The operation S70 is to form the auxiliary cathodes on a side of the transparent cathode layer in the grooves facing away from the light-emitting layer.

In the operation S20 above, firstly a whole layer of planarization layer can be formed on the drive wire layer, where the planarization layer can be made of a resin material; and then the planarization layer can be exposed and etched using a half tone mask, where the transmittance of the mask at the positions of the via-holes of the respective anodes is higher than the transmittance of the mask at the positions of the grooves. In this way, the via-holes for connecting the anodes with the thin film transistors and the grooves between the anodes can be formed in one patterning process. Further, the via-holes and the grooves can be formed in two patterning processes to thereby simplify the fabrication process, although the embodiments of the disclosure will not be limited thereto.

The respective anodes are formed on a surface of the planarization layer outside the grooves after the patterning process, where the anodes are reflective anodes, and an Ag-ITO compound layer can be formed via vapor-depositing and sputtering, where the metal silver layer is the reflection layer 141 above, and the indium tin oxide layer can be the transparent conductive layer 142.

After the transparent conductive layers 142 are formed, a whole layer of light-emitting layer can be formed on the anodes and the grooves via vapor-depositing, and thereafter a whole layer of transparent cathode layer can be formed on the light-emitting layer, where the transparent cathode layer can be made of indium zinc oxide (IZO), an Mg—Ag alloy, etc.

Thereafter the conductive adhesive including the conductive particles can be injected into the grooves through printing to form the auxiliary cathodes connected with the transparent cathode layer, where the conductive particles doped in the conductive adhesive can be powder of gold, silver, copper, aluminum, zinc, iron, or nickel, or graphite, or a conductive compound. The conductive adhesive can be isotropic filler type conductive adhesive which can be cured at moderate temperature, although the embodiments of the disclosure will not be limited thereto.

In the display panel and the display device according to the embodiments of the disclosure, the display panel includes: a base substrate, a drive wire layer on the base substrate, a planarization layer on a side of the drive wire layer facing away from the base substrate, a plurality of anodes in a form of an array on a side of the planarization layer facing away from the drive wire layer, a light-emitting layer on sides of respective anodes and the planarization layer facing away from the drive wire layer, and a transparent cathode layer on a side of the light-emitting layer facing away from the anodes, where the planarization layer includes grooves between the respective nodes; and the display panel further includes auxiliary cathodes in the grooves and on a surface of the transparent cathode layer on a side thereof facing away from the light-emitting layer. The grooves for forming the auxiliary cathodes are formed on the planarization layer, and the auxiliary cathodes are arranged in the grooves, so that the transparent cathode layer can be made of a transparent conductive material, and the auxiliary cathodes can be formed directly on the transparent cathode layer in the grooves, and thus come into contact with the transparent cathode layer, thus lowering the total resistance of a cathode while improving the transmittance thereof, and facilitating displaying of an image.

Although the preferred embodiments of the disclosure have been described, those skilled in the art benefiting from the underlying inventive concept can make additional modifications and variations to these embodiments. Therefore the appended claims are intended to be construed as encompassing the preferred embodiments and all the modifications and variations coming into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:
1. A display panel, comprising:
 a base substrate;
 a drive wire layer on the base substrate;
 a planarization layer on a side of the drive wire layer facing away from the base substrate;
 a plurality of anodes in a form of an array on a side of the planarization layer facing away from the drive wire layer;
 a light-emitting layer on sides of the plurality of anodes and the planarization layer facing away from the drive wire layer; and
 a transparent cathode layer on a side of the light-emitting layer facing away from the plurality of anodes;
 wherein the planarization layer comprises grooves between respective anodes;

the display panel further comprises auxiliary cathodes, in the grooves, on a surface of the transparent cathode layer on a side thereof facing away from the light-emitting layer; and a material of the auxiliary cathodes is an opaque conductive adhesive with conductive particles dispersed therein.

2. The display panel according to claim 1, wherein the conductive particles comprise one or more of gold, silver, copper, aluminum, zinc, iron, nickel, or graphite.

3. The display panel according to claim 1, wherein surfaces of the auxiliary cathodes on sides thereof facing away from the base substrate are flush with a surface of the transparent cathode layer, outside the grooves, on a side thereof facing away from the base substrate; or surfaces of the auxiliary cathodes on sides thereof facing away from the base substrate are lower than a surface of the transparent cathode layer, outside the grooves, on a side thereof facing away from the base substrate.

4. The display panel according to claim 1, wherein the display panel further comprises: an encapsulation cover plate on a side of the transparent cathode layer facing away from the light-emitting layer, and a color filter layer on a surface of the encapsulation cover plate on a side thereof facing the transparent cathode layer; and the color filter layer comprises:

color filter blocks corresponding to the plurality of anodes in a one-to-one manner, and light-shielding layers between respective color filter blocks.

5. The display panel according to claim 4, wherein orthographic projections of the light-shielding layers onto the base substrate lie into orthographic projections of the auxiliary cathodes onto the base substrate; and widths of the auxiliary cathodes in the grooves are greater than or equal to widths of corresponding light-shielding layers.

6. The display panel according to claim 4, wherein thicknesses of the light-shielding layers are greater than thicknesses of the respective color filter blocks; and the light-shielding layers come into contact with auxiliary cathodes corresponding thereto in position, and gaps exist between the respective color filter blocks and the transparent cathode layer.

7. The display panel according to claim 1, wherein the display panel further comprises: an encapsulation layer on a surface of the transparent cathode layer on a side thereof facing away from the light-emitting layer, and a color filter layer on a surface of the encapsulation layer on a side thereof facing away from the transparent cathode layer; and the color filter layer comprises:

color filter blocks corresponding to the plurality of anodes in a one-to-one manner, and light-shielding layers between respective color filter blocks.

8. The display panel according to claim 7, wherein orthographic projections of the light-shielding layers onto the base substrate lie into orthographic projections of the auxiliary cathodes onto the base substrate; and widths of the auxiliary cathodes in the grooves are greater than or equal to widths of corresponding light-shielding layers.

9. The display panel according to claim 7, wherein the light-shielding layers come into contact with auxiliary cathodes corresponding thereto in position; and orthographic projections of the encapsulation layer and the light-shielding layers onto the base substrate do not overlap with each other.

10. The display panel according to claim 1, wherein at least one of the plurality of anodes comprises: a reflection layer on a surface of the planarization layer on a side thereof facing away from the drive wire layer, and a transparent conductive layer on a surface of the reflection layer on a side thereof facing away from the planarization layer; and the transparent conductive layer is only on the surface of the reflection layer, or is on both the surface of the reflection layer and a surface of an inner sidewall of a corresponding groove.

11. A display device, comprising a display panel, wherein the display panel comprises:

a base substrate;

a drive wire layer on the base substrate;

a planarization layer on a side of the drive wire layer facing away from the base substrate;

a plurality of anodes in a form of an array on a side of the planarization layer facing away from the drive wire layer;

a light-emitting layer on sides of the plurality of anodes and the planarization layer facing away from the drive wire layer; and a transparent cathode layer on a side of the light-emitting layer facing away from the plurality of anodes;

wherein the planarization layer comprises grooves between respective anodes;

the display panel further comprises auxiliary cathodes, in the grooves, on a surface of the transparent cathode layer on a side thereof facing away from the light-emitting layer; and a material of the auxiliary cathodes is an opaque conductive adhesive with conductive particles dispersed therein.

12. The display device according to claim 11, wherein the conductive particles comprise one or more of gold, silver, copper, aluminum, zinc, iron, nickel, or graphite.

13. The display device according to claim 11, wherein surfaces of the auxiliary cathodes on sides thereof facing away from the base substrate are flush with a surface of the transparent cathode layer, outside the grooves, on a side thereof facing away from the base substrate; or surfaces of the auxiliary cathodes on sides thereof facing away from the base substrate are lower than a surface of the transparent cathode layer, outside the grooves, on a side thereof facing away from the base substrate.

14. The display device according to claim 11, wherein the display panel further comprises: an encapsulation cover plate on a side of the transparent cathode layer facing away from the light-emitting layer, and a color filter layer on a surface of the encapsulation cover plate on a side thereof facing the transparent cathode layer; and the color filter layer comprises: color filter blocks corresponding to the plurality of anodes in a one-to-one manner, and light-shielding layers between respective color filter blocks; or the display panel further comprises: an encapsulation layer on a surface of the transparent cathode layer on a side thereof facing away from the light-emitting layer, and a color filter layer on a surface of the encapsulation layer on a side thereof facing away from the transparent cathode layer; and the color filter layer comprises: color filter blocks corresponding to the plurality of anodes in a one-to-one manner, and light-shielding layers between respective color filter blocks.

15. The display device according to claim 14, wherein orthographic projections of the light-shielding layers onto the base substrate lie into orthographic projections of the auxiliary cathodes onto the base substrate; and widths of the auxiliary cathodes in the grooves are greater than or equal to widths of corresponding light-shielding layers.

16. The display device according to claim 14, wherein when the display panel further comprises the encapsulation cover plate on the side of the transparent cathode layer facing away from the light-emitting layer, and the color filter layer on the surface of the encapsulation cover plate on the side thereof facing the transparent cathode layer, thicknesses of the light-shielding layers are greater than thicknesses of the respective color filter blocks; and the light-shielding layers come into contact with auxiliary cathodes corresponding thereto in position, and gaps exist between the respective color filter blocks and the transparent cathode layer.

17. The display device according to claim 14, wherein when the display panel further comprises the encapsulation layer on the surface of the transparent cathode layer on the side thereof facing away from the light-emitting layer, and the color filter layer on the surface of the encapsulation layer on the side thereof facing away from the transparent cathode layer, the light-shielding layers come into contact with auxiliary cathodes corresponding thereto in position; and orthographic projections of the encapsulation layer and the light-shielding layers onto the base substrate do not overlap with each other.

18. The display device according to claim 11, wherein at least one of the plurality of anodes comprises: a reflection layer on a surface of the planarization layer on a side thereof facing away from the drive wire layer, and a transparent conductive layer on a surface of the reflection layer on a side thereof facing away from the planarization layer; and the transparent conductive layer is only on the surface of the reflection layer, or is on both the surface of the reflection layer and a surface of an inner sidewall of a corresponding groove.

* * * * *